United States Patent
Wang et al.

(10) Patent No.: US 11,276,814 B2
(45) Date of Patent: Mar. 15, 2022

(54) SPIN-ORBIT TORQUE MAGNETIC RANDOM ACCESS MEMORY

(71) Applicant: The Hong Kong University of Science and Technology, Hong Kong (CN)

(72) Inventors: Xiangrong Wang, Hong Kong (CN); Yin Zhang, Hong Kong (CN); Huaiyang Yuan, Hong Kong (CN)

(73) Assignee: The Hong Kong University of Science and Technology, Hong Kong (CN)

(*) Notice: Subject to any disclaimer, the term of this patent is extended or adjusted under 35 U.S.C. 154(b) by 0 days.

(21) Appl. No.: 16/757,559

(22) PCT Filed: Nov. 28, 2018

(86) PCT No.: PCT/IB2018/001529
§ 371 (c)(1),
(2) Date: Apr. 20, 2020

(87) PCT Pub. No.: WO2019/106436
PCT Pub. Date: Jun. 6, 2019

(65) Prior Publication Data
US 2021/0202829 A1   Jul. 1, 2021

Related U.S. Application Data

(60) Provisional application No. 62/707,998, filed on Nov. 29, 2017.

(51) Int. Cl.
*G11C 11/00* (2006.01)
*H01L 43/04* (2006.01)
(Continued)

(52) U.S. Cl.
CPC .............. *H01L 43/04* (2013.01); *G06N 10/00* (2019.01); *G11C 11/161* (2013.01);
(Continued)

(58) Field of Classification Search
CPC ......... H01L 43/04; H01L 43/06; H01L 43/10; H01L 27/222; H01L 11/161; H01L 11/18;
(Continued)

(56) References Cited

U.S. PATENT DOCUMENTS 8,908,424 B2   12/2014   Wang et al.
9,646,670 B2   5/2017   Lee et al.
(Continued)

FOREIGN PATENT DOCUMENTS

CN   104393169 A   3/2015
KR   10-2017-0090807 A   8/2017

OTHER PUBLICATIONS

Zang, Yin et al., "Breaking the current density threshold in spin-orbit-torque magnetic random access memory" (Year: 2018).*
(Continued)

*Primary Examiner* — Alexander Sofocleous
(74) *Attorney, Agent, or Firm* — Saliwanchik, Lloyd & Eisenschenk

(57) ABSTRACT

Methods and devices for a spintronic device of spin-orbit torque magnetic random access memory (SOT-MRAM) are provided. A unit cell of a device can comprise a ferromagnetic (or ferrimagnetic or antiferromagnetic) layer on the heavy metal layer, and a current source configured to transmit either non-collinear current pulses in the heavy-metal layer or two perpendicular currents in the heavy metal layer. The current pulses exhibit a phase difference, and the magnitude of a sum of the respective current pulses is constant (in its simplest form) and the flow direction of the pulses is time-dependent.

18 Claims, 4 Drawing Sheets

(51) Int. Cl.
    *G06N 10/00*   (2022.01)
    *G11C 11/16*   (2006.01)
    *G11C 11/18*   (2006.01)
    *H01L 27/22*   (2006.01)
    *H01L 43/06*   (2006.01)
    *H01L 43/10*   (2006.01)
    *H03K 19/18*   (2006.01)
    *H03K 19/20*   (2006.01)

(52) U.S. Cl.
    CPC .......... *G11C 11/1675* (2013.01); *G11C 11/18* (2013.01); *H01L 27/222* (2013.01); *H01L 43/06* (2013.01); *H01L 43/10* (2013.01); *H03K 19/18* (2013.01); *H03K 19/20* (2013.01)

(58) Field of Classification Search
    CPC .... G11C 11/161; G11C 11/18; G11C 11/1675
    See application file for complete search history.

(56) References Cited

U.S. PATENT DOCUMENTS

| | | | | |
|---|---|---|---|---|
| 9,691,458 | B2* | 6/2017 | Ralph | H01F 10/3263 |
| 9,741,414 | B2 | 8/2017 | Qiu et al. | |
| 10,559,747 | B1* | 2/2020 | Li | H01L 43/04 |
| 10,686,127 | B2* | 6/2020 | Wu | H01L 43/10 |
| 2015/0200003 | A1* | 7/2015 | Buhrman | H01L 43/08 365/158 |
| 2016/0225424 | A1 | 8/2016 | Qiu et al. | |
| 2016/0267961 | A1 | 9/2016 | Lee et al. | |
| 2017/0229160 | A1 | 8/2017 | Ma et al. | |
| 2017/0279038 | A1 | 9/2017 | Wu et al. | |
| 2018/0033956 | A1* | 2/2018 | Hyunsoo | H01L 43/10 |
| 2018/0106873 | A1* | 4/2018 | Wu | G01R 33/093 |
| 2018/0166197 | A1* | 6/2018 | Wang | H01L 43/06 |

OTHER PUBLICATIONS

International Search Report in International Application No. PCT/IB2018/001529, filed Nov. 28, 2018.

Fukami, S. et al., "A spin-orbit torque switching scheme with collinear magnetic easy axis and current configuration," *Nature Nanotechnology*, Jul. 2016, 11:621-626, Macmillan Publishers Limited.

Liu, L. et al., "Spin-Torque Switching with the Giant Spin Hall Effect of Tantalum," *Science*, May 4, 2012, 336:555-558.

Lee, J. M. et al., "Oscillatory spin-orbit torque switching induced by field-like torques," *Communications Physics*, 2018, 1(2):1-7.

Safeer, C. K. et al., "Spin-orbit torque magnetization switching controlled by geometry," *Nature Nanotechnology*, Feb. 2016, 11:143-147, Macmillan Publishers Limited.

* cited by examiner

SPIN-ORBIT TORQUE MAGNETIC RANDOM ACCESS MEMORY

CROSS-REFERENCE TO RELATED APPLICATIONS

This application is the U.S. national stage application of International Patent Application No. PCT/IB2018/001529, filed Nov. 282018: which claims the benefit of U.S. Provisional Patent Application Ser. No. 62/707,998, filed Nov. 29, 2017, each of which is hereby incorporated by reference in its entirety including any tables, figures, or drawings.

This application claims the benefit of U.S. Provisional Patent Application Ser. No. 62/707,998, filed Nov. 29, 2017, which is hereby incorporated by reference in its entirety including any tables, figures, or drawings.

TECHNICAL FIELD

This disclosure relates to methods and devices capable of writing and processing data with very low current density for magnetic (ferromagnetic or ferrimagnetic or antiferromagnetic) random access memory at sub-nanosecond speed.

BACKGROUND OF THE INVENTION

Spin-orbit-torque magnetic random access memory (SOT-MRAM) is believed to be the next generation of data storage and logic cells that have separated read and write paths. Conventional magnetic field induced magnetization reversal is a matured technology that suffers from scalability and field localization problems for nanoscale devices. Spin-transfer-torque magnetic random-access memory is an alternative technology in nano-spintronics, however it is hampered by Joule heating, device durability, and reliability issues.

In a SOT-MRAM device, an electric current in the heavy metal layer generates a pure spin current through the spin-Hall effect that flows perpendicularly into a magnetic layer. The spin current produces spin-orbit torques (SOT) through spin angular momentum transfer and/or the Rashba effect.

SOT-MRAM is a promising technology because charge current does not pass through the memory cells and therefore the cells do not suffer from issues related to Joule heating. In principle, such devices are infinitely durable due to negligible heating from the spin-current. However, the electric current density required to generate a large enough SOT for a magnetization reversal is in the order of $10^{11} \sim 10^{12}$ A/m$^2$. To have a reasonable switching speed (order of GHz), the current density should be larger than $10^{12}$ A/m$^2$, which is too large for many devices. Therefore, in order to make use of the SOT-MRAM, the current density must be lowered by at least one order of magnitude.

BRIEF SUMMARY OF THE INVENTION

This brief summary provides a basic understanding of some aspects of the disclosed systems, methods, and devices. This summary is not an extensive overview of the disclosure. It is intended to neither identify key or critical elements of the disclosure nor delineate any scope of particular embodiments of the disclosure, or any scope of the key features. Its sole purpose is to present some concepts of the disclosure in a simplified form as a prelude to the more detailed description that is presented later.

In accordance with one or more embodiments and corresponding disclosure, various non-limiting aspects are described in connection with systems and methods for SOT-MRAM. In an embodiment, two alternating electric current flows are applied non-collinearly or (in the simplest form) perpendicularly in the heavy-metal layer of a ferromagnetic/heavy-metal bilayer and/or multiple layers. In an aspect, the phases of the two alternating currents are correlated such that the total current density magnitude is constant (in the simplest case) while its direction rotates in a desirable way. In another aspect, an array of such elements can be readily integrated to form the basic architecture of an MRAM device. The minimal reversal current density in this setup can be as low as $10^8$ A/m$^2$. The current density magnitude required to reverse the magnetization in a few nanoseconds is around $10^9$ A/m$^2$, which is lower than the value required in conventional schemes.

The following description and the drawings set forth certain illustrative aspects of the disclosure. These aspects are indicative, however, of but a few of the various ways in which the principles of the disclosure may be employed. Other aspects of the disclosure will become apparent from the following detailed description of the disclosure when considered in conjunction with the drawings.

BRIEF DESCRIPTION OF THE DRAWINGS

FIG. 4(*b*) illustrates an example of a logic device where the current J'$_1$ from the cell 1, which depends on the state of cell 1, and the current J'$_2$ from the cell 2, which depends on the state of cell 2, are used to control the state of the cell 3. Each cell is a spin valve structure or other normal spintronics memory devices.

FIG. 5(*b*) is a plot illustrating the minimal reversal currents as functions of field-like torque strength. FIG. 5(*c*) is a plot illustrating an example of the current pulse used to switch the magnetization using the herein described systems and methods. FIG. 5(*d*) is a plot illustrating an example of the trajectory of magnetization reversal of the herein described systems and methods.

DETAILED DISCLOSURE OF THE INVENTION

The following disclosure and exemplary embodiments are presented to enable one of ordinary skill in the art to make and use a SOT-MRAM device according to the subject invention. Various modifications to the embodiments will be readily apparent to those skilled in the art and the generic principles herein may be applied to other embodiments. Thus, the devices and methods related to the SOT-MRAM device are not intended to be limited to the embodiments shown, but are to be accorded the widest scope consistent with the principles and features described herein.

SOT-MRAMs are memory devices to process and transport binary information. The information is encoded by the magnetization direction in the magnetic layer of an SOT-MRAM element, where one SOT-MRAM element includes a composite structure of ferromagnetic (or ferrimagnetic or antiferromagnetic)/heavy-metal bilayer or multiple layers and associated electrodes. The processing of data, i.e. the manipulation of magnetization, is realized by SOT generated by the electric current passing through the heavy-metal layer.

In a ferromagnetic/heavy-metal bilayer or multiple layers, an electric current in the heavy-metal layer generates a pure spin current flowing into the magnetic layer by the spin-Hall effect. The spin current generates SOT via spin angular momentum transfer and/or the Rashba effect.

An electric current of constant magnitude and time-dependent flow direction in the heavy-metal layer can be used to reduce the electric current required to reverse the magnetization and accelerate the magnetization reversal speed. This can be realized by using two or even more non-collinear currents, for example two perpendicular currents, passing through the heavy-metal layer.

Figure 1A:
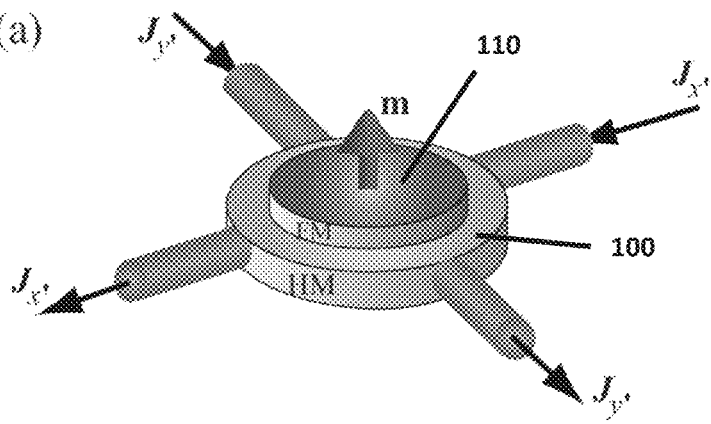
FIG. 1(*a*)-1(*c*) illustrates an example of a SOT-MRAM element that contains a ferromagnetic/heavy-metal bilayer with two currents flowing perpendicularly in the heavy-metal layer.
Figure 1B:
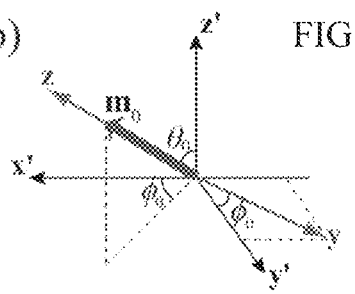
Figure 1C:
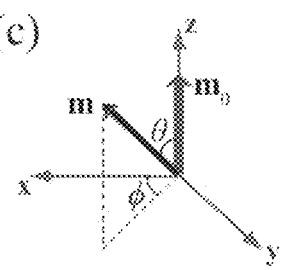
Figure 2:
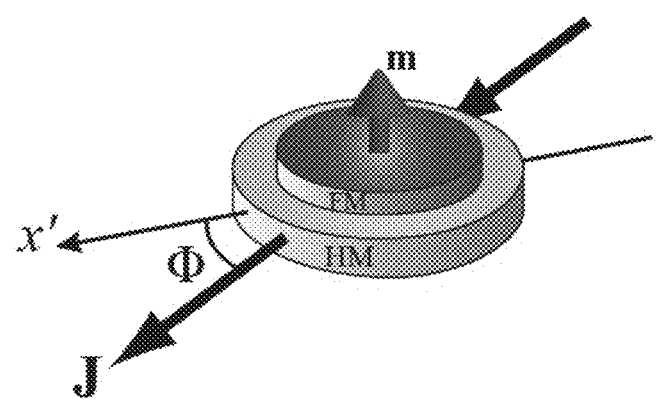
FIG. 2 illustrates another example of SOT-MRAM element that contains a ferromagnetic/heavy-metal bilayer with two currents flowing non-collinearly such that the total current has an angle Φ from the x'-axis in the heavy-metal layer.

FIG. 1(a)-1(c) shows a ferromagnetic 100/heavy-metal 110 bilayer that can achieve magnetization reversal through SOT generated by an electric current with time-dependent flow direction. The ferromagnetic layer 100 comprises either an in-plane magnetic material or an out-of-plane magnetic material. The in-plane magnetic material can be or include at least one of permalloy, yttrium iron garnet, Fe, Co, NiFe, CoFeB, YIG, GdFe, and/or any other soft or hard magnetic material. The out-of-plane magnetic material can comprise at least one of CoFeB, Co, CoFe, GdFe, GdFeCo, and/or any other magnetic material with strong crystal anisotropy. The heavy-metal layer 110 can be formed of at least one of Ta, Pt, W, Pd, $Bi_2Se_3$, and/or other strong spin-orbit coupling material. The ferromagnetic 100/heavy-metal bilayer 110 lies in the x'y'-plane. $m=m_0$ and $m=-m_0$ are two stable points of the system in the absence of an electric current where m is the unit direction of the local magnetization M=Mm with saturation magnetization M. An xyz-coordinate is defined where the z-axis is along $m_0$ and the y-axis is in the x'y'-plane. $\theta_0$ and $\phi_0$ are the polar and azimuthal angles of $m_0$ in x'y'z'-coordinate. Two electric currents with time dependent magnitudes are applied along the x'- and y'-directions. The magnitude of the total current is kept a constant so that the electric current vector is $J=J\cos\Phi\hat{x}'+J\sin\Phi\hat{y}'$, where (between J and $\hat{x}'$ is time-dependent, as shown in FIG. 2.

Figure 3:
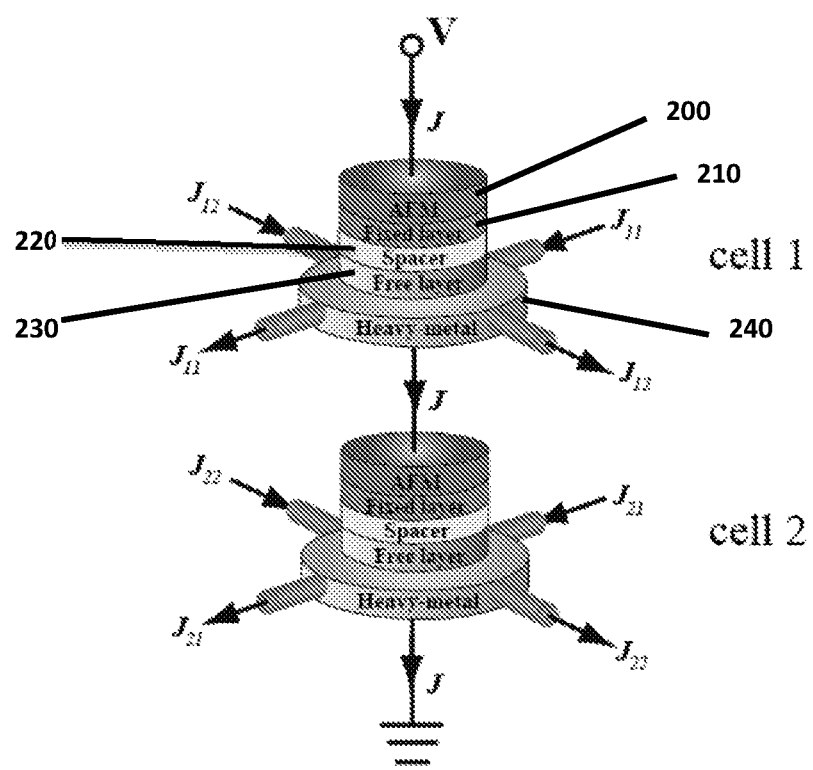
FIG. 3 illustrates an example of two cells that are connected by a current J, where each cell is a spin valve structure or other normal spintronics memory devices.

Two or more cells can be electrically connected where each cell can be a ferromagnetic/heavy-metal bilayer, spin valve structure, or other normal spintronics memory devices. FIG. 3 shows an example that two cells with spin valve structures are connected by a current J. Each cell can be structured similarly. An antiferromagnetic layer 200 can be used to fix the magnetization of layer 210. The fixed layer 210 is separated from a free layer 230 by a spacer 220. The free layer 230 can be on a heavy metal layer 240.

Figure 4A:
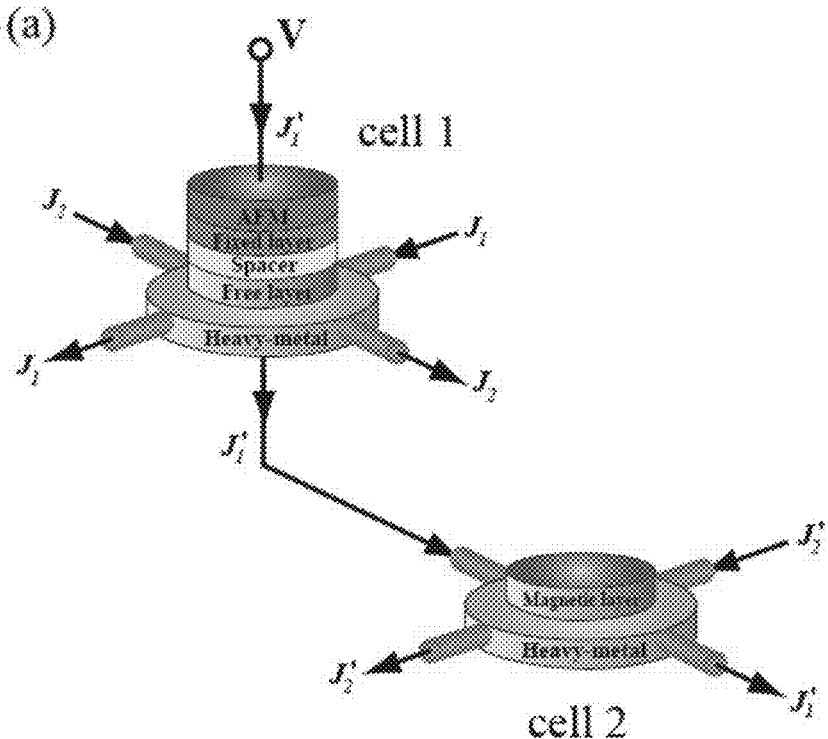
FIG. 4(*a*) illustrates an example of a logic device, where the current J'$_1$ from the cell 1, which depends on the state of cell 1, is used to control the state of the cell 2. Each cell is a spin valve structure or other normal spintronics memory devices.
Figure 4B:
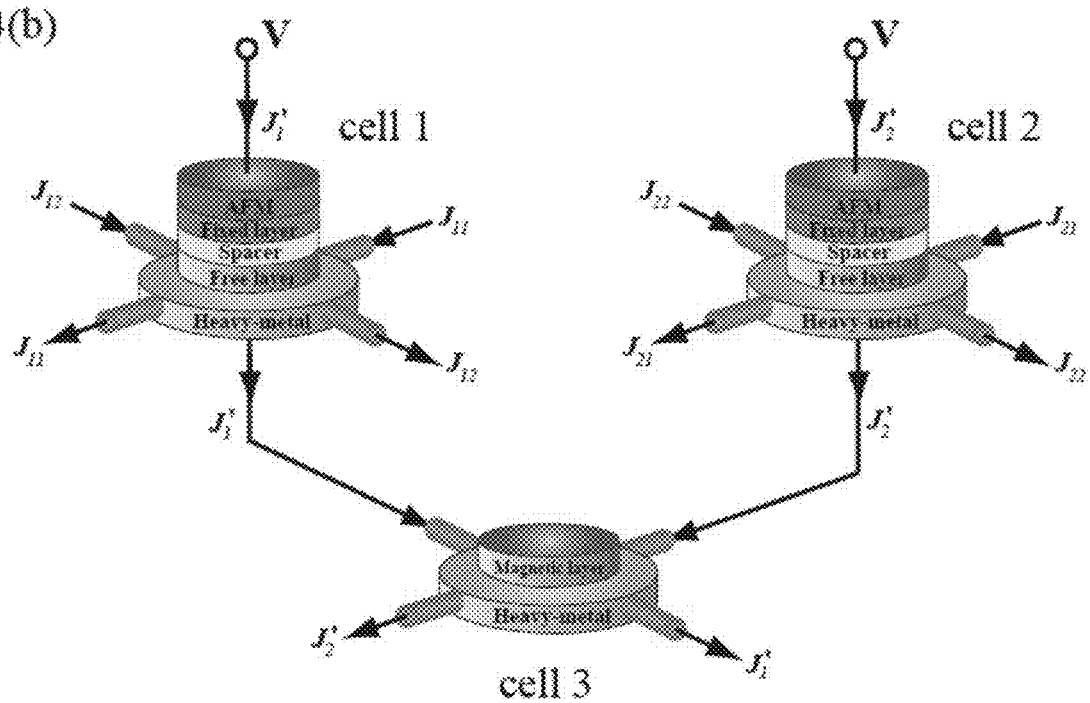

Logic devices can be also realized by using one or more cells to control other cells. FIG. 4(a) shows an example, in which one cell can control another cell. The current $J'_1$ from the cell 1, which depends on the state of the cell 1, is used to control the state of the cell 2. FIG. 4(b) shows another example that two cells can control one cell. The current $J'_1$ from the cell 1, which depends on the state of cell 1, and the current $J'_2$ from the cell 2, which depends on the state of cell 2, are used to control the state of the cell 3. Each cell is a spin valve structure or other normal spintronics memory devices. Therefore, the unit cells seen in FIGS. 1-4 can be used to realize logic gates, including but not limited to AND, OR, NOT, NAND, NOR, and XOR gates.

The electric current can generate a spin current into the magnetic layer by the spin-Hall effect, and an effective SOT on the magnetization can be produced:

$$\vec{\tau} = -am\times(m\times\hat{s}) + \beta am\times\hat{s},$$

where the first and second terms on the right-hand-side are respectively the Slonczewski-like torque and field-like torque. The spin-polarization direction is $\hat{s}=\hat{J}\times\hat{z}'$ where $\hat{J}$ is the unit vector of current flow. The dimensionless coefficient $$a = \frac{\hbar}{2ed}\theta_{SH}J,$$

where $\hbar$, e, d and $\theta_{SH}$ are respectively the reduced Plank constant, the electron charge, the thickness of magnetic layer, and the spin-Hall angle. $\beta$ measures the strength of field-like torque.

Under an in-plane current flowing in the heavy-metal layer, the magnetization dynamics is governed by the generalized dimensionless Landau-Lifshitz-Gilbert (LLG) equation, $$\frac{\partial m}{\partial t} = -m \times h_{eff} + \alpha m \times \frac{\partial m}{\partial t} + \vec{\tau},$$

where the Gilbert damping constant $\alpha$ is typically much smaller than unity, and the effective field is $h_{eff}=-\nabla_m\varepsilon$ from the energy density $\varepsilon$. Time, magnetic field and energy density are respectively in units of $(\gamma M)^{-1}$, M and $\mu_0 M^2$ with $\gamma$ the gyromagnetic ratio and $\mu_0$ the vacuum magnetic permeability.

It is convenient to describe m by a polar angle $\theta$ and an azimuthal angle $\phi$ in the xyz-coordinate. In terms of $\theta$ and $\phi$, the generalized LLG equation becomes $(1+\alpha^2)\dot{\theta} = h_{eff,\phi} + as_\theta - \beta as_\phi + \alpha(h_{eff,\theta} - as_\phi - \beta as_\theta) \equiv F_1$ $(1+\alpha^2)\dot{\phi}\sin\theta = -h_{eff,\theta} + as_\phi + \beta as_\theta + \alpha(h_{eff,\phi} + as_\theta - \beta as_\phi)$
$\equiv F_2,$ where $$h_{eff,\theta} = -\frac{\partial\varepsilon}{\partial\theta} \text{ and } h_{eff,\phi} = -\frac{\partial\varepsilon}{\sin\theta\partial\phi}.$$

$s_\theta$ and $s_\phi$ are $s_\theta=\cos\theta_0\sin(\Phi-\phi_0)\cos\theta\cos\phi-\cos(\Phi-\phi_0)\cos\theta\sin\phi-\sin\theta_0\sin(\Phi-\phi_0)\sin\theta$ and $s_\phi=-\cos\theta_0\sin(\Phi-\phi_0)\sin\phi-\cos(\Phi-\phi_0)\cos\phi$.

One can find the optimal current pulse $\Phi(t)$ by which the reversal current can be much lower, and the magnetization reversal time from $\theta=0$ to $\theta=\pi$ for a given current magnitude is the shortest. The optimal current pulse can be solved by the Euler-Lagrange equation:

$$\frac{\partial F}{\partial\phi} = \frac{d}{d\theta}\left(\frac{\partial F}{\partial(\partial\phi/\partial\theta)}\right), \frac{\partial F}{\partial\Phi} = \frac{d}{d\theta}\left(\frac{\partial F}{\partial(\partial\Phi/\partial\theta)}\right),$$

where $F = (1+\alpha^2)/F_1 + \lambda G$ with the constraint $$\frac{\partial \phi}{\partial \theta} \sin\theta F_1 - F_2 \equiv G = 0.$$

$\lambda$ is the Lagrange multiplier that can be determined self-consistently by the Euler-Lagrange equation.

Consider a uniaxial system as an example where the easy-axis is along the z'-axis and the energy density function is $\varepsilon = -K \cos^2 \theta$ with K the anisotropy coefficient. Through rigorous mathematical calculation, the optimal current pulse in our proposal can be solved from the Euler-Lagrange equations:

$$\Phi = \tan^{-1}\left(\frac{1-\alpha\beta}{\alpha+\beta}\cos\theta\right) + \phi + \pi(\beta < -\alpha),$$

$$\Phi = \tan^{-1}\left(\frac{1-\alpha\beta}{\alpha+\beta}\cos\theta\right) + \phi(\beta > -\alpha),$$

such that the reversal time from $\theta=0$ to $\theta=\pi$ is the shortest. There is a singular point $\beta=-\alpha$ which leads to $\dot\theta=0$ when the magnetization reaches the equator $\theta=\pi/2$, so that there is no current pulse can reverse the magnetization over $\theta=\pi/2$.

The time evolutions of $\theta$ and $\phi$ under the optimal current pulse are described as follows:

$$\dot\theta = \frac{1}{1+\alpha^2}[aP(\theta) - \alpha K \sin 2\theta]$$

$$\dot\phi = \frac{1}{1+\alpha^2}\left[2K\cos\theta - a(\alpha+\beta)(1-\alpha\beta)\frac{\sin\theta}{P(\theta)}\right],$$

with $P(\theta)=\sqrt{(\alpha+\beta)^2+(1-\alpha\beta)^2\cos^2\theta}$. Then one can find the relation between $\dot\theta$ and current magnitude J from the expression of a as follows:

$$J = \frac{2e\mu_0 M^2 d}{\hbar \theta_{SH} P(\theta)}[(1+\alpha^2)\dot\theta + \alpha K \sin 2\theta].$$

Because $\dot\theta$ should not be negative to realize a magnetization reversal, one can find the theoretical limit of minimal reversal current $J_c$ by setting the lowest $\dot\theta$ to be zero:

$$J_c = \frac{2\alpha e K d}{\theta_{SH} \hbar} Q,$$

where all quantities are in their natural units, and $Q \equiv \max\{\sin 2\theta / P(\theta)\}$ for $\theta \in [0, \pi]$.

The trajectory of magnetization reversal is $$\phi(\theta) = \int_0^\theta \frac{\dot\phi}{\dot\theta} d\theta'.$$

One can also find the time-dependence of $\theta$ as $\theta(t)=t^{-1}(\theta)$ with $t(\theta)=\int_0^\theta d\theta'/\dot\theta$. Once $\Phi(\theta,\phi)$, $\phi(\theta)$ and $\theta(t)$ are known, the time-dependent $\phi$ and $\Phi$ can be found as $\phi(t)=\phi(\theta(t))$ and $\Phi(t)=\Phi(\theta(t),\phi(t))$.

Figure 5A:
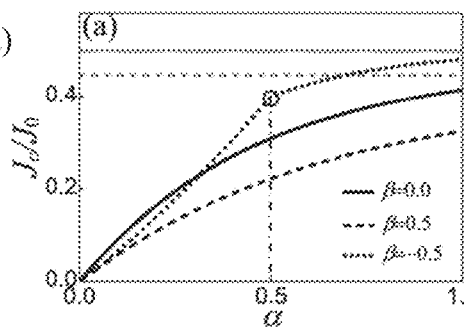
FIG. 5(*a*) is a plot illustrating a comparison of the minimal reversal currents as functions of damping constant between the herein described scheme and a conventional scheme.

FIG. 5(a) compares the minimal reversal current of a conventional setup $J_c^{dc}$ with that of herein described $J_c$. In the case of $\beta=0$, $$J_c^{dc} = \frac{2e\mu_0 M d}{\theta_{SH} \hbar}\left(\frac{H_K}{2} - \frac{H}{\sqrt{2}}\right)$$

where $H_K=2K/(\mu_0 M)$, and a magnetic field H along the current flow is required for deterministic reversal. A nonzero $\beta$ can tune $J_c^{dc}$ from the above equation. In FIG. 5(a), the damping-dependence of $J_c$ is plotted as black curves for various $\beta$, while $J_c^{dc}$ are plotted by gray curves. The expression of $J_c$ shows that the minimal reversal current is scaled by the damping constant of the ferromagnetic layer. For a typical magnetic material used in SOT-MRAM, the damping constant is on the order of 0.001, and even 10-5 for popular Yttrium-Iron-Garnet (YIG), therefore, the minimal reversal current Je can be three to five orders of magnitude lower than that of a conventional setup.

Figure 5B:
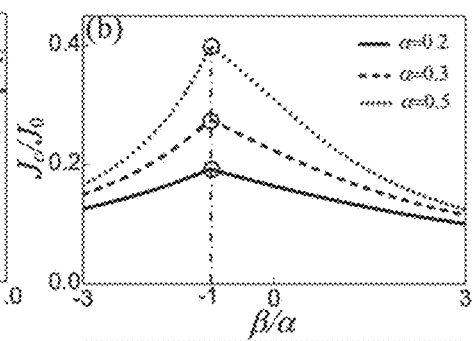
Figure 5C:
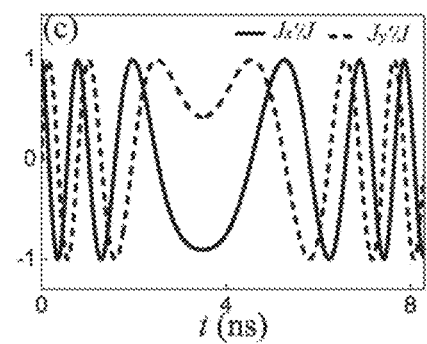
Figure 5D:
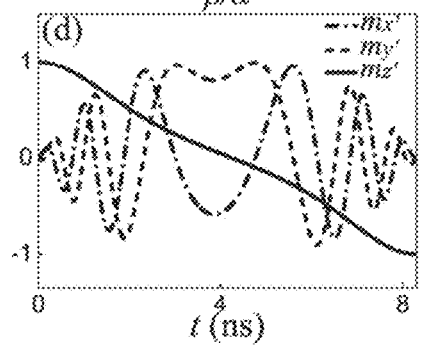
Figure 6:
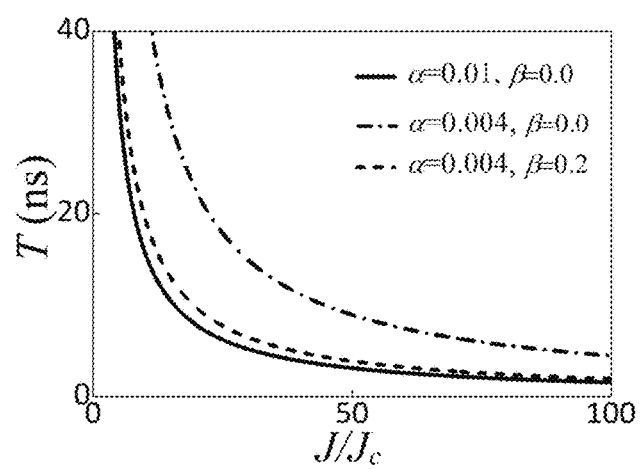
FIG. 6 is a plot illustrating reversal time as a function of current density magnitude.

FIG. 5(b) plots $J_c$ vs $\beta/\alpha$ for various $\alpha$. $J_c$ decreases with $|\beta|$ when $\beta<-\alpha$ and $\beta>0$, while $J_c$ increases with $|\beta|$ when $-\alpha<\beta<0$. FIGS. 5(c) and 5(d) show an example of optimal current pulse and the corresponding trajectory of magnetization reversal. The parameters are $M=3.5\times10^5$ A/m, $K=1.54\times10^4$ J/m³, $\alpha=0.004$, $\beta=0.2$ and $\theta_{SH}=0.25$ to mimic commonly used material CoFeB/Ta where Ta is found to have less effect on the damping constant $\alpha$, and the current magnitude is $J=8.5\times10^9$ A/m². Under the optimal current pulse, $J_c=3.26\times10^8$ A/m² which is far below $J_c^{dc}=9.6\times10^{10}$ A/m² obtained recently. With $J=8.5\times10^9$ A/m², the magnetization can be reversed over $\theta=\pi/2$ within a few nanoseconds under the optimal current pulse. In FIG. 6 the shortest reversal time T under the optimal current pulse is plotted as functions of current magnitude J. With increasing current magnitude, the shortest reversal time quickly reduces to the order of nanoseconds.

For a perpendicularly magnetized layer, the herein described methods and systems can achieve field-free magnetization reversal by using an electric current with time-dependent flow direction, while a magnetic field or exchange bias are required in a conventional reversal scheme. The magnetization can be reversed from $\theta=0$ to $\theta=\pi$, while the conventional reversal scheme can only reverse the magnetization to a direction near $\pi/2$ resulting in a reliability problem. By reversing the current direction of the optimal current pulse, the magnetization reversal from $\theta=\pi$ to $\theta=0$ can be easily realized.

Embodiments of the subject invention can also be applied to other cases like in-plane magnetized layer, bi-axial anisotropy, or even nonzero magnetic field, where one can solve the Euler-Lagrange equations to find the corresponding optimal current pulse and then achieve a much lower reversal current and the shortest reversal time for a given current magnitude. Embodiments of the subject invention can be used in a quantum computing structure.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are purposes only and that various modifications or changes in light thereof will be suggested to persons skilled in the art and are to be included within the spirit and purview of this application and the scope of the appended claims. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

What is claimed is:

1. A SOT-MRAM device comprising a first unit cell, the first unit cell comprising:
   a heavy metal layer;
   a ferromagnetic layer on the heavy metal layer; and
   a current source configured to transmit non-collinear current pulses into the heavy-metal layer,
   wherein the current source is configured to transmit respective non-collinear current pulses with a phase difference between them, and wherein a magnitude of a sum of the respective non-collinear current pulses is constant and a flow direction is time-dependent.

2. The device of claim 1, wherein the heavy-metal layer comprises at least one of Ta, Pt, W, Pd, and $Bi_2Se_3$.

3. The device of claim 1, wherein the ferromagnetic layer comprises either an in-plane magnetic material or an out-of-plane magnetic material.

4. The device of claim 3, wherein the in-plane magnetic material comprises at least one of permalloy, yttrium iron garnet, Fe, Co, NiFe, CoFeB, CoFe, YIG, and GdFe.

5. The device of claim 3, wherein the out-of-plane magnetic material comprises at least one of CoFeB, Co, CoFe, GdFe, and GdFeCo.

6. The device of claim 1, further comprising two first unit cells, wherein one first unit cell is configured to be controlled by an electrical current from the other first unit cell.

7. The device of claim 1, further comprising a plurality of first units cells that are configured to form a logic gate, wherein the logic gate comprises one of an AND gate, an OR gate, a NOT gate, a NAND gate, a NOR gate, and an XOR gate.

8. The device of claim 1, wherein the non-collinear current pulses are perpendicular to each other.

9. A SOT-MRAM device comprising a second unit cell, the second unit cell comprising:
   a heavy metal layer;
   a free layer on the heavy metal layer;
   a spacer on the free layer;
   a fixed layer on the spacer;
   an antiferromagnetic layer on the fixed layer; and
   a current source configured to transmit non-collinear currents pulses into the heavy-metal layer,
   wherein the current source is configured to transmit respective non-collinear current pulses with a phase difference between them, and wherein a magnitude of a sum of the respective non-collinear current pulses is constant and a flow direction is time-dependent.

10. The device of claim 9, wherein the heavy metal layer comprises at least one of Ta, Pt, W, Pd, and $Bi_2Se_3$.

11. The device of claim 9, further comprising a first unit cell, the first unit cell comprising a heavy metal layer; a ferromagnetic layer or the heavy metal layer; and a current source configured to transmit non-collinear current pulses into the heavy metal layer, wherein the first unit cell is configured to be controlled by an electrical current from the second unit cell.

12. The device of claim 11, wherein the first unit cell is configured to receive non-collinear current pulses into its heavy-metal layer.

13. The device of claim 9, further comprising a plurality of first and second unit cells that are configured to form a logic gate, wherein the logic gate comprises one of an AND gate, an OR gate, a NOT gate, a NAND gate, a NOR gate, and an XOR gate.

14. The device of claim 9, further comprising two second unit cells, each as described in claim 9, wherein one second unit cell is configured to be controlled by an electrical current from the other second unit cell.

15. The device of claim 14, wherein the one second unit cell is configured to receive non-collinear current pulses into its heavy-metal layer.

16. The device of claim 9, further comprising a plurality of second unit cells configured to form a logic gate, wherein the logic gate comprises one of an AND gate, an OR gate, a NOT gate, a NAND gate, a NOR gate, and an XOR gate.

17. The device of claim 9, wherein the non-collinear current pulses are perpendicular to each other.

18. A method of producing a qubit in a quantum computing structure; the method comprising:
   providing a ferromagnetic layer on the heavy metal layer;
   transmitting, by a current source, non-collinear current pulses into the heavy-metal layer; and
   transmitting the non-collinear current pulses with a phase difference between them, wherein a magnitude of a sum of the respective non-collinear current pulses is constant and a flow direction is time-dependent.

* * * * *